United States Patent
Nam et al.

(10) Patent No.: US 8,350,348 B2
(45) Date of Patent: Jan. 8, 2013

(54) MAGNETIC MEMORY DEVICES AND METHODS OF FORMING THE SAME

(75) Inventors: KyungTae Nam, Suwon-si (KR); Byeungchul Kim, Suwon-si (KR); Seung-Yeol Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/417,402

(22) Filed: Mar. 12, 2012

(65) Prior Publication Data
US 2012/0168887 A1 Jul. 5, 2012

Related U.S. Application Data

(62) Division of application No. 13/050,056, filed on Mar. 17, 2011, now Pat. No. 8,163,569.

(30) Foreign Application Priority Data

Mar. 18, 2010 (KR) .................. 10-2010-0024334

(51) Int. Cl.
*H01L 29/82* (2006.01)
(52) U.S. Cl. ............. 257/421; 257/422; 257/E43.006; 365/130; 365/158; 365/171; 365/173
(58) Field of Classification Search .......... 257/421, 257/422, E43.006; 365/130, 158, 171, 173
See application file for complete search history.

(56) References Cited

U.S. PATENT DOCUMENTS

| | | |
|---|---|---|
| 6,473,337 B1 | 10/2002 | Tran et al. |
| 8,018,011 B2 | 9/2011 | Ranjan et al. |
| 8,063,459 B2 | 11/2011 | Ranjan et al. |
| 2002/0086182 A1 | 7/2002 | Fujikata et al. |
| 2003/0231437 A1 | 12/2003 | Childress et al. |
| 2006/0017081 A1 | 1/2006 | Sun et al. |
| 2007/0076469 A1 | 4/2007 | Ashida et al. |
| 2007/0172964 A1 | 7/2007 | Yen et al. |
| 2007/0187785 A1 | 8/2007 | Hung et al. |
| 2007/0297222 A1 | 12/2007 | Leuschner |
| 2008/0164548 A1 | 7/2008 | Ranjan et al. |
| 2009/0135644 A1 | 5/2009 | Nebashi et al. |
| 2009/0141540 A1 | 6/2009 | Miura et al. |
| 2009/0173977 A1 | 7/2009 | Xiao et al. |
| 2011/0044096 A1 | 2/2011 | Li |
| 2011/0141796 A1 | 6/2011 | Lee et al. |
| 2011/0210410 A1 | 9/2011 | Ding et al. |

FOREIGN PATENT DOCUMENTS

| | | |
|---|---|---|
| KR | 1020040061280 A | 7/2004 |
| KR | 1020050010428 A | 1/2005 |
| KR | 1020100082610 A | 7/2010 |

*Primary Examiner* — Asok K Sarkar
(74) *Attorney, Agent, or Firm* — Myers Bigel Sibley & Sajovec

(57) ABSTRACT

Provided are a magnetic memory device and a method of forming the same. The method may include forming a pinning pattern on a substrate; forming a first interlayer insulating layer that exposes the pinning pattern on the substrate; forming a pinned layer, a tunneling barrier layer and a second magnetic conductive layer on the pinning pattern; and forming a pinned pattern, a tunnel barrier pattern and a second magnetic conductive pattern by performing a patterning process on the pinned layer, the tunnel barrier layer and the second magnetic conductive layer.

8 Claims, 8 Drawing Sheets

MAGNETIC MEMORY DEVICES AND METHODS OF FORMING THE SAME

CROSS-REFERENCE TO RELATED APPLICATION

This U.S. non-provisional patent application claims priority under 35 U.S.C. §120 as a divisional application of U.S. patent application Ser. No. 13/050,056, filed Mar. 17, 2011 now U.S. Pat. No. 8,163,569, which in turn claims priority under 35 U.S.C. §119 from Korean Patent Application No. 10-2010-0024334, filed on Mar. 18, 2010. The entire contents of both of the above applications are hereby incorporated by reference in their entireties.

BACKGROUND OF THE INVENTIVE CONCEPT

The present inventive concept relates to memory devices and, more particularly, to magnetic memory devices and to methods of forming such devices.

As the demand for electronic devices that have fast operating speeds and low power consumption increases, there is a need for memory devices for these electronic devices that perform fast read/write operations and operate at a low operating voltage. Magnetic memory devices have been studied as a memory devices that may satisfy these requirements.

Generally, magnetic memory devices may include a magnetic tunnel junction pattern. The magnetic tunnel junction pattern is formed from two magnetic substances and an insulating layer that is interposed therebetween. A resistance of the magnetic tunnel junction pattern changes based on the magnetization directions of the two magnetic substances. More specifically, when the magnetization directions of the two magnetic substances are anti-parallel to each other, the magnetic tunnel junction pattern has a high resistance value, while when the magnetization directions of the two magnetic substances are parallel to each other, the magnetic tunnel junction pattern has a smaller resistance value. These resistance values can be used to represent data, and thus data can be stored in a magnetic memory cell by programming the cell to have the appropriate resistance value.

SUMMARY

Embodiments of the inventive concept provide methods of forming a magnetic memory device. Pursuant to these methods, a pinning pattern may be formed on a substrate. A first interlayer insulating layer that exposes the pinning pattern may be formed on the substrate. A pinned layer, a tunneling barrier layer and a magnetic conductive layer may be formed on the pinning pattern. The pinned layer, the tunneling barrier layer and the magnetic conductive layer may be patterned to form a pinned pattern, a tunnel barrier pattern and a magnetic conductive pattern on the pinning pattern.

Embodiments of the inventive concept also provide methods of forming a magnetic memory device. These methods may include forming a first magnetic conductive pattern on a substrate. A first interlayer insulating layer that exposes the first magnetic conductive pattern is formed on the substrate. A tunnel barrier layer and a second magnetic conductive layer are formed on the first magnetic conductive pattern. The tunnel barrier layer and the second magnetic conductive layer are patterned to form a tunnel barrier pattern and a second magnetic conductive pattern on the first magnetic conductive pattern.

Embodiments of the inventive concept also provide magnetic memory devices. These magnetic memory device may include a first magnetic conductive pattern on a substrate; a first interlayer insulating layer that exposes the first magnetic pattern on the substrate; a tunnel barrier pattern on the first magnetic pattern: and a second magnetic conductive pattern on the tunnel barrier pattern, wherein widths of the tunnel barrier pattern and the second magnetic conductive pattern are greater than a width of the first magnetic conductive pattern.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
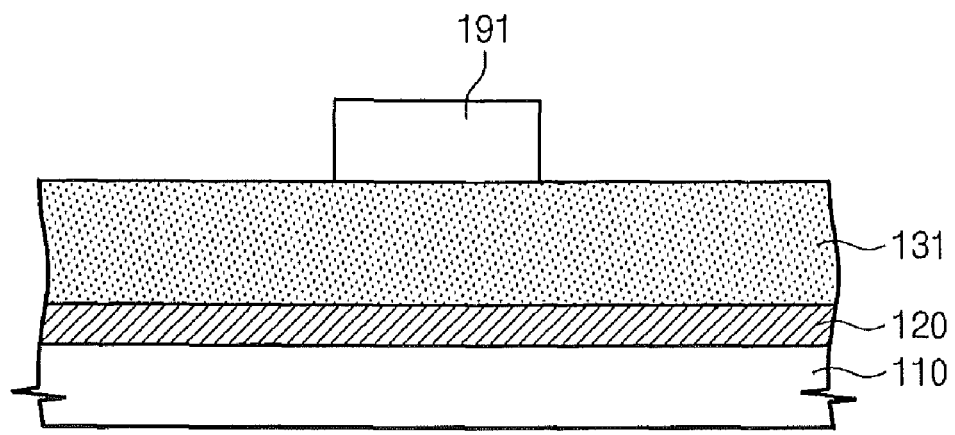
FIGS. 1 through 4 are cross-sectional drawings illustrating a magnetic memory device in accordance with a first embodiment of the inventive concept and a method of forming the same.

Preferred embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

In the drawings, the thickness of layers and regions may be exaggerated for clarity. It will also be understood that when an element such as a layer, region or substrate is referred to as being "on" another element, it may lie directly on the other element or intervening elements may also be present. It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," and "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept are described herein with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present inventive concept.

Hereinafter, a magnetic memory device in accordance with embodiments of the inventive concept and a method of forming the same will be described in detail with reference to FIGS. 1-4.

Referring to FIG. 1, a lower electrode layer 120 and a pinning layer 131 may be formed on a substrate 110. The substrate 110 may include a conductive region and/or an active region. The substrate 110 may be an arbitrary semiconductor-based structure having a silicon surface including, for example, a semiconductor wafer, a semiconductor epitaxial layer, a semiconductor layer on a semiconductor or non-semiconductor substrate, etc. The semiconductor substrate may thus include, for example, silicon on insulator (SOI), silicon germanium SiGe, germanium Ge, gallium arsenide GaAs, or doped or undoped silicon. The lower electrode layer 120 can be electrically connected to an active region of the substrate 110. The lower electrode layer 120 can be formed of at least one material selected from a group consisting of a transition metal, a conductive transition metal nitride and a conductive ternary system nitride. The lower electrode layer 120 can be formed, for example, by a sputtering process or a plasma-enhanced chemical vapor deposition process.

The pinning layer 131 may include an anti-ferromagnetic material. The pinning layer 131 may include, for example at least one material selected from PtMn, IrMn, MnO, MnS, MnTe, $MnF_2$, $FeCl_2$, FeO, $CoCl_2$, CoO, $NiCl_2$, NiO and Cr. In further embodiments, the pinning layer 131 may include at least one precious metal. The precious metal may include, for example, ruthenium Ru, rhodium Rh, palladium Pd, osmium Os, iridium Ir, platinum Pt, gold Au and/or silver Ag. As shown in FIG. 1, a first mask pattern 191 may be provided on the pinning layer 131.

Figure 2:
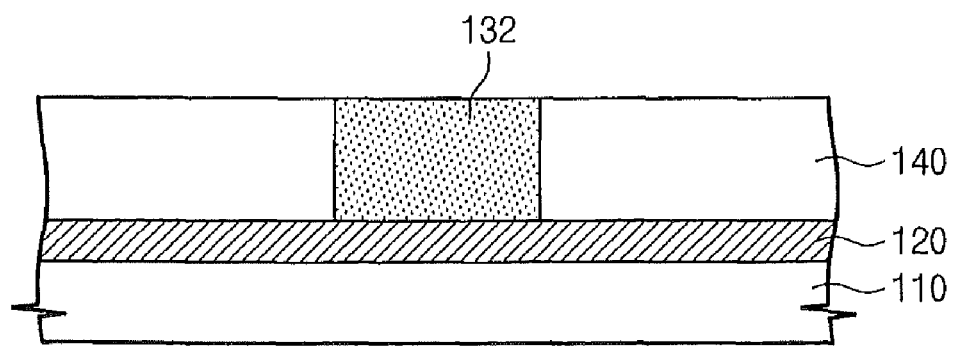

Referring to FIG. 2, a first patterning process is performed on the pinning layer 131 to form a pinning pattern 132. The first patterning process can be performed using the first mask pattern 191 as an etch mask. For example, the first patterning process may be an ion sputtering and/or a reactive ion etch process. A first interlayer insulating layer 140 that exposes the pinning pattern 132 may be formed on the substrate 110. The first interlayer insulating layer 140 may be formed by forming an insulating layer that covers the substrate 110 and the pinning pattern 132, and then planarizing the insulating layer to expose the pinning pattern 132. After the planarization process is completed, a cleaning process may be performed. After the planarization process, a layer of the same material as the pinning pattern 132 may be thinly deposited on an upper surface of the pinning pattern 132 before forming a pinned layer, which will be described below.

The first interlayer insulating layer 140 may be, for example, an oxide layer, a nitride layer or an oxynitride layer. In some embodiments, the first interlayer insulating layer may be formed by a chemical vapor deposition (CVD) process. After the first patterning process is completed, the first mask pattern 191 can be removed.

Figure 3:
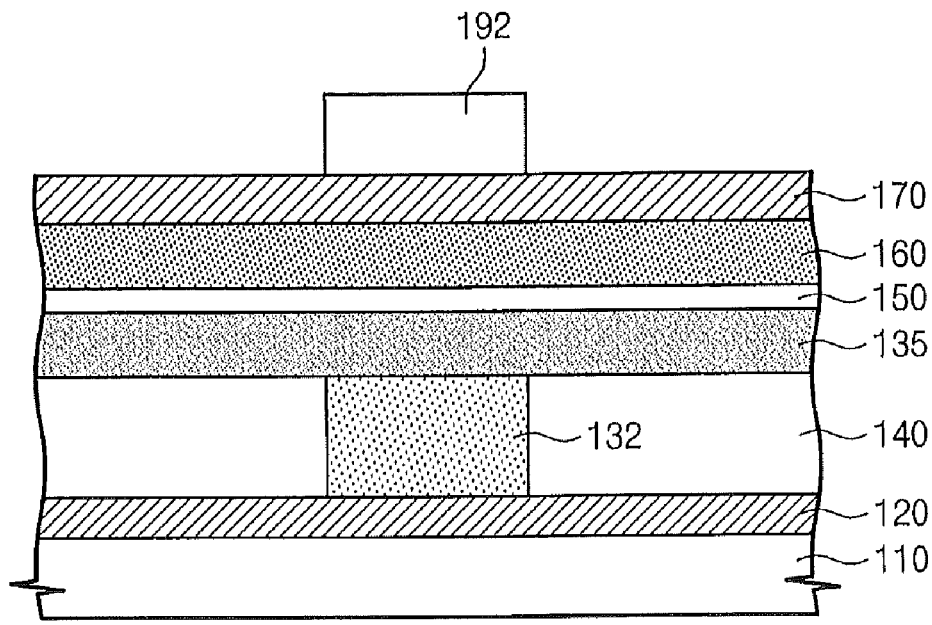

Referring to FIG. 3, a pinned layer 135, a tunnel barrier layer 150, a second magnetic conductive layer 160 and an upper electrode layer 170 may be sequentially formed on the pinning pattern 132 and the first interlayer insulating layer 140. The pinned layer 135 may include a ferromagnetic material. In some embodiments, the pinned layer 135 may include at least one material selected from the group of CoFeB, Fe, Co, Ni, Gd, Dy, CoFe, NiFe, MnAs, MnBi, MnSb, $CrO_2$, $MnOFe_2O_3$, $CoFe_2O_3$, $FeOFe_2O_3$, $NiOFe_2O_3$, $CuOFe_2O_3$, $MgOFe_2O_3$, EuO and $Y_3Fe_5O_{12}$.

The tunnel barrier layer 150 may include a nonmagnetic insulating material. The tunnel barrier layer 150 may include, for example, magnesium oxide or aluminum oxide. The second magnetic conductive layer 160 may include one or more materials having a changeable magnetic direction. In some embodiments, the second magnetic conductive layer 160 may include a ferromagnetic material. For example, the second magnetic conductive layer 160 may include at least one material selected from CoFeB, Fe, Co, Ni, Gd, Dy, CoFe, NiFe, MnAs, MnBi, MnSb, $CrO_2$, $MnOFe_2O_3$, $CoFe_2O_3$, $FeOFe_2O_3$, $NiOFe_2O_3$, $CuOFe_2O_3$, $MgOFe_2O_3$, EuO and $Y_3Fe_5O_{12}$.

The second magnetic conductive layer 160 may include a plurality of layers. For example, the second magnetic conductive layer 160 may include multiple layers that include a ferromagnetic material and layers including a nonmagnetic material that are interposed between the layers that include a ferromagnetic material. In such embodiments, the layers that include ferromagnetic materials and the layers that include a nonmagnetic material can constitute a synthetic antiferromagnetic layer. The synthetic antiferromagnetic layer can reduce a critical current density of a magnetic memory device and can improve a thermal stability thereof.

The upper electrode layer 170 may be the same material as the lower electrode layer 120. A capping layer (not illustrated) may be further formed between the second magnetic conductive layer 160 and the upper electrode layer 170. A second mask pattern 192 may be formed on the upper electrode layer 170. The pinned layer 135, the second magnetic conductive layer 160 and the upper electrode layer 170 can be formed, for example, by sputtering processes or by chemical vapor deposition processes. The tunnel barrier layer 150 can be formed, for example, by a thermal oxidation process or a chemical vapor deposition process.

Figure 4:
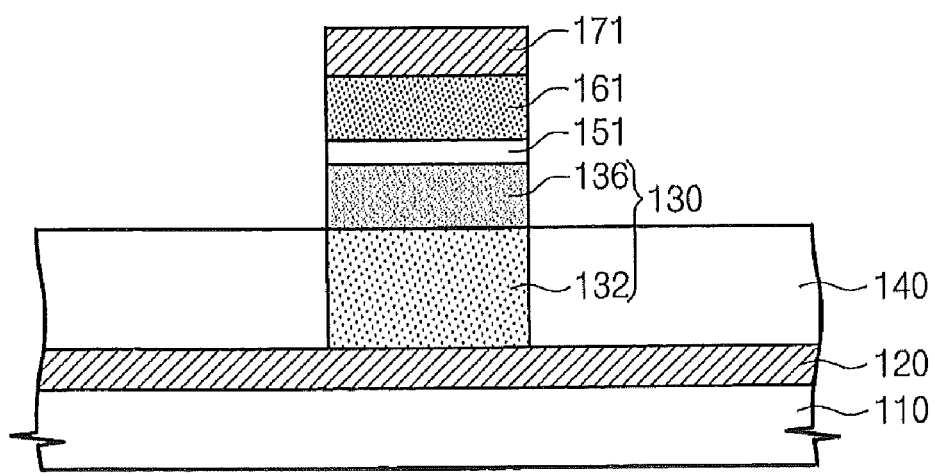

Referring to FIG. 4, a second patterning process is performed on the pinned layer 135, the tunnel barrier layer 150, the second magnetic conductive layer 160 and the upper electrode layer 170 to form a pinned pattern 136, a tunnel barrier pattern 151, a second magnetic conductive pattern 161 and an upper electrode pattern 171. The second patterning process can be performed using the second mask pattern 192 as an etch mask. The second patterning process may expose the first interlayer insulating layer 140. In embodiments where exposure of the first interlayer insulating layer 140 marks the end point of the second patterning process, the second patterning process may be performed until a light emitting wavelength of the element constituting the first interlayer insulating layer 140 is measured.

In other embodiments, the upper electrode layer 170 may be patterned separately from the second patterning process to form the upper electrode pattern 171. The second patterning process may be an ion sputtering process and/or a reactive ion etching process. The second patterning process may be performed so that the pinned pattern 136 overlaps the pinning pattern 132. For example, a sidewall of the pinned pattern 136 may be aligned with a sidewall of the pinning pattern 132. A first magnetic conductive pattern 130 including the pinning pattern 132 and the pinned pattern 136 may be completed by the second patterning process. A magnetization direction of the pinned pattern 136 can be fixed in a specific direction by the pinning pattern 132. As a result, the pinned pattern 136 can have a fixed magnetization direction.

A magnetization direction of the second magnetic conductive pattern 161 may be changed by an electric/magnetic cause provided from inside and/or outside of the magnetic memory cell. If the magnetization direction of the second magnetic conductive pattern 161 and the magnetization direction of the first magnetic conductive pattern 130 are parallel to each other, the magnetic resistance of the magnetic memory cell that includes the second magnetic conductive pattern 161 and the first magnetic conductive pattern 130 will have a value in a first range, whereas if the magnetization direction of the second magnetic conductive pattern 161 and the magnetization direction of the first magnetic conductive pattern 130 are anti-parallel to each other, the magnetic resistance of the magnetic memory cell that includes the second magnetic conductive pattern 161 and the first magnetic conductive pattern 130 will have a value in a second range. Thus, data can be stored in the magnetic memory cell by setting the second magnetic conductive pattern 161 and the first magnetic conductive pattern 130 to either be parallel or anti-parallel to each other.

After the second patterning process, the second mask pattern 192 may be removed. A portion of the second mask pattern 192 may be removed during the second patterning process. In other embodiments, the second mask pattern 192 can be left on the upper electrode pattern 171. After the second patterning process is completed, a second interlayer insulating layer (not illustrated) may be formed that covers the first interlayer insulating layer 140 and the upper electrode pattern 171.

When the first patterning process is performed on the pinning layer 131, a residual etching by-product may be generated. A portion of the residual etching by-product may be a conductive material. In some embodiments, the residual etching by-product of the pinning layer 131 may include precious metal. Since the precious metal is not easily oxidized, a portion of the residual etching by-product of the pinning layer 131 may have conductivity. If a conductive residual etching by-product adheres to a sidewall of the tunnel barrier pattern 151, when a magnetic memory cell operates, a short-circuit may occur. According to a first embodiment of the inventive concept, the pinning layer 131 may be patterned before the second patterning process is performed. As a result, the potential for a residual etching by-product of the pinning layer 131 to adhere to a sidewall of the tunnel barrier pattern 151 may be reduced or prevented.

A magnetic memory device in accordance with a second embodiment of the inventive concept and a method of forming the same will be described in detail with reference to FIGS. 5 through 8. For purposes of brevity, the description of common features already discussed above will be omitted.

Figure 5:
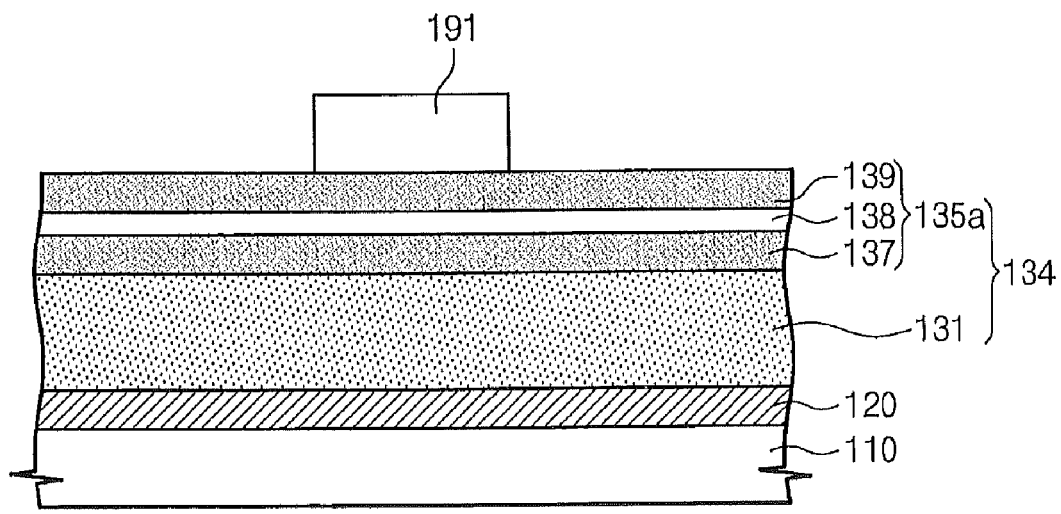
FIGS. 5 through 8 are cross-sectional drawings illustrating a magnetic memory device in accordance with a second embodiment of the inventive concept and a method of forming the same.

Referring to FIG. 5, a lower electrode layer 120 may be provided on a substrate 110. A first magnetic conductive layer 134 may be formed on the lower electrode 120. The first magnetic conductive layer 134 may include a pinning layer 131 and a pinned layer 135a. The pinning layer 131 may include an anti-ferromagnetic material. In some embodiments, the pinning layer 131 may include at least one material selected from PtMn, IrMn, MnO, MnS, MnTe, $MnF_2$, $FeCl_2$, FeO, $CoCl_2$, CoO, $NiCl_2$, NiO and Cr. In other embodiments, the pinning layer 131 may include at least one precious metal. The precious metal may include, for example, ruthenium Ru, rhodium Rh, palladium Pd, osmium Os, iridium Ir, platinum Pt, gold Au and/or silver Ag.

The pinned layer 135a may be formed on the pinning layer 131. The pinned layer 135a may have a magnetization direction that is fixed by the pinning layer 131. The pinned layer 135a may include a ferromagnetic material. In an example embodiment, the pinned layer 135a may include a first ferromagnetic layer 137, a second ferromagnetic layer 139 and a nonmagnetic layer 138 that is provided between the first ferromagnetic layer 137 and the second ferromagnetic layer 139. A magnetization direction of the first ferromagnetic layer 137 may be fixed by the pinning layer 131. A magnetization direction of the second ferromagnetic layer 139 may be fixed in anti-parallel to the magnetization direction of the first ferromagnetic layer 137. The nonmagnetic layer 138 can fix the magnetization directions of the first and second ferromagnetic layers 137 and 139 so that they are anti-parallel to each other.

The first ferromagnetic layer 137 and the second ferromagnetic layer 139 may each include a ferromagnetic material. For example, the first ferromagnetic layer 137 and the second ferromagnetic layer 139 may include at least one ferromagnetic material selected from CoFeB, Fe, Co, Ni, Gd, Dy, CoFe, NiFe, MnAs, MnBi, MnSb, $CrO_2$, $MnOFe_2O_3$, $CoFe_2O_3$, $FeOFe_2O_3$, $NiOFe_2O_3$, $CuOFe_2O_3$, $MgOFe_2O_3$, EuO and $Y_3Fe_5O_{12}$. The nonmagnetic layer 138 may include a precious metal. In example embodiments, the nonmagnetic layer 138 may include at least one precious metal selected from ruthenium Ru, iridium Ir and rhodium Rh. A first mask pattern 191 may be provided on the pinned layer 135a.

Figure 6:
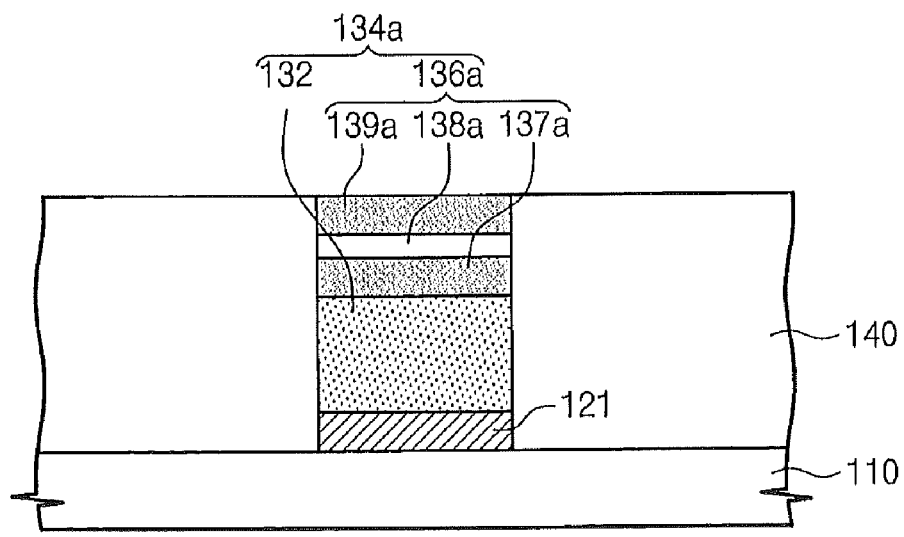

Referring to FIG. 6, a first patterning process is performed on the lower electrode layer 120 and the first magnetic conductive layer 134 to form a lower electrode pattern 121 and a first magnetic conductive pattern 134a. The first magnetic conductive pattern 134a may include a pinning pattern 132 and a pinned pattern 136a. The pinned pattern 136a may include a first ferromagnetic pattern 137a, a nonmagnetic pattern 138a and a second ferromagnetic pattern 139a. The first patterning process can be performed using the first mask pattern 191 as an etching mask. For example, the first pattering process may be an ion sputtering process and/or a reactive ion etching process. After the first pattering process is completed, the first mask pattern 191 may be removed.

A first interlayer insulating layer 140 that exposes the first magnetic conductive pattern 134a may be formed on the substrate 110. After forming an insulating layer covering the substrate 110 and the first magnetic conductive pattern 134a, the first interlayer insulating layer 140 can be formed by performing a planarization process so that the first magnetic conductive pattern 134a is exposed. The first interlayer insulating layer 140 may be, for example, an oxide layer, a nitride layer or an oxynitride layer. In some embodiments, the first interlayer insulating layer 140 may be formed by a chemical vapor deposition process.

Figure 7:
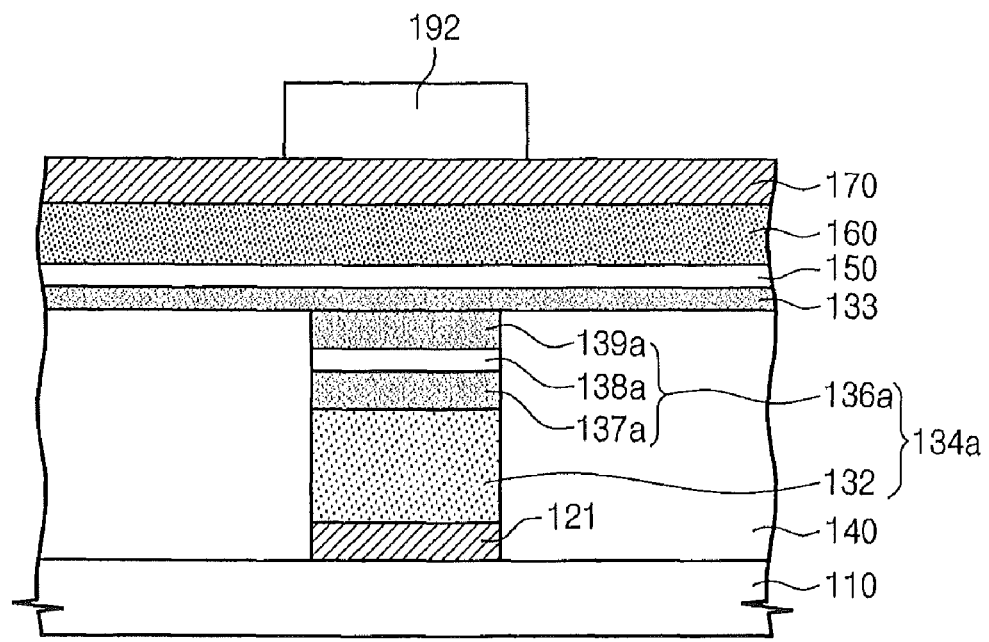

Referring to FIG. 7, a tunneling barrier layer 150, a second magnetic conductive layer 160 and an upper electrode layer 170 may be sequentially formed on the first magnetic conductive pattern 134a and the first interlayer insulating layer 140. The tunneling barrier layer 150 may include a nonmagnetic insulating material. The tunneling barrier layer 150 may include, for example, magnesium oxide or aluminum oxide. The second magnetic conductive layer 160 may include material having a changeable magnetization direction. The second magnetic conductive layer 160 may include a ferromagnetic material. For example, the second magnetic conductive layer 160 may include at least one material selected from CoFeB, Fe, Co, Ni, Gd, Dy, CoFe, NiFe, MnAs, MnBi, MnSb, $CrO_2$, $MnOFe_2O_3$, $CoFe_2O_3$, $FeOFe_2O_3$, $NiOFe_2O_3$, $CuOFe_2O_3$, $MgOFe_2O_3$, EuO and $Y_3Fe_5O_{12}$.

The second magnetic conductive layer 160 may include a plurality of layers. For example, the second magnetic conductive layer 160 may include at least two layers that include a ferromagnetic material and layer(s) including a nonmagnetic insulating material that are interposed between the layers that include the ferromagnetic material. The layers including the ferromagnetic material and the layers including a nonmagnetic insulating material can constitute a synthetic antiferromagnetic layer. The synthetic antiferromagnetic layer can reduce a critical current density of the magnetic memory device and can improve the thermal stability thereof.

The upper electrode layer 170 may be formed of the same material as the lower electrode layer 120. A capping layer (not illustrated) may be further formed between the second magnetic conductive layer 160 and the upper electrode layer 170. As shown in FIG. 7, an additional ferromagnetic layer 133 may be formed between the tunnel barrier layer 150 and the first magnetic conductive pattern 134a. The additional ferromagnetic layer 133 may have a small thickness. For example, the additional ferromagnetic layer 133 may be formed to have a thickness of 10 Å or less. The additional ferromagnetic layer 133 may be formed of the same material as the second ferromagnetic pattern 139a. The additional ferromagnetic layer 133 may have the same magnetization direction as the magnetization direction of the second ferromagnetic pattern 139a. The additional ferromagnetic layer 133 may improve the stability of the growth of the tunnel barrier layer 150. A second mask pattern 192 may be provided on the upper electrode layer 170.

Figure 8:
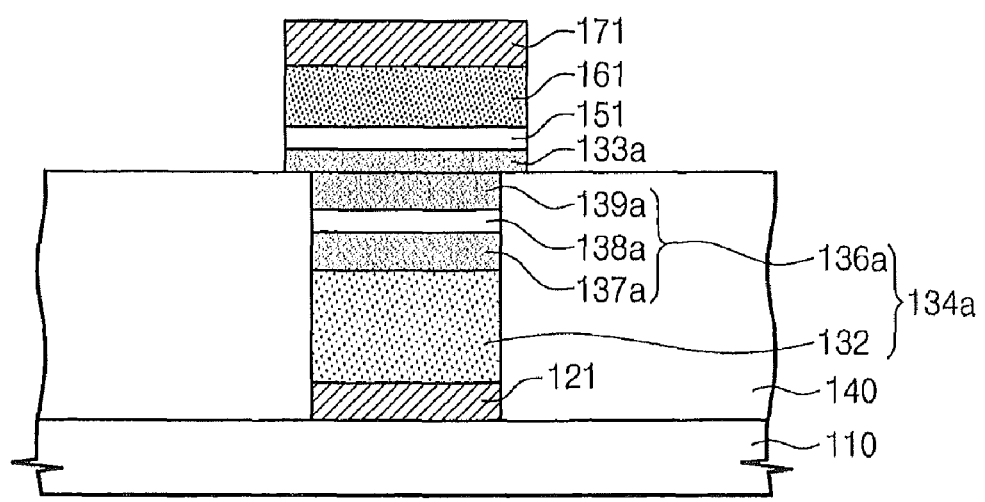

Referring to FIG. 8, a second patterning process may be performed on the additional ferromagnetic layer 133, the tunnel barrier layer 150, the second magnetic conductive layer 160 and the upper electrode layer 170. An additional ferromagnetic pattern 133a, a tunnel barrier pattern 151, a second magnetic conductive pattern 161 and an upper electrode pattern 171 may be formed by the second patterning process. In other embodiments, the upper electrode layer 170 may be patterned separately from the second patterning process to form the upper electrode pattern 171. The second patterning process may be performed using the second mask pattern 192 as an etching mask. The second patterning process may expose the first interlayer insulating layer 140. For example, in some embodiments, the second patterning process may be performed until a light emitting wavelength of the element that constitutes the first interlayer insulating layer 140 is measured. In some embodiments, the second patterning process may be an ion sputtering process and/or a reactive ion etching process. The second patterning process may be performed so that the width of the additional ferromagnetic pattern 133a is greater than the width of the second ferromagnetic pattern 139a. By forming the additional ferromagnetic pattern 133a to have a width that is greater than the width of the second ferromagnetic pattern 139a, a misalignment problem may be prevented. In other embodiments, the width of the additional ferromagnetic pattern 133a may be smaller than the width of the second ferromagnetic pattern 139a. In the case that a width of the additional ferromagnetic pattern 133a is smaller than a width of the second ferromagnetic pattern 139a, it is easier to pattern so that the additional ferromagnetic pattern 133a completely overlaps the second ferromagnetic pattern 139a.

A magnetization direction of the second magnetic conductive pattern 161 may be changed by an electric/magnetic cause provided from outside and/or inside of the magnetic memory cell. If the magnetization direction of the second magnetic conductive pattern 161 and the magnetization direction of the first magnetic conductive pattern 134a are parallel to each other, the magnetic resistance of the magnetic memory cell that includes the second magnetic conductive pattern 161 and the first magnetic conductive pattern 134a may have a value in a first range, whereas if the magnetization direction of the second magnetic conductive pattern 161 and the magnetization direction of the first magnetic conductive pattern 134a are anti-parallel to each other, the magnetic resistance of the magnetic memory cell that includes the second magnetic conductive pattern 161 and the first magnetic conductive pattern 134a may have a value in a second range. Thus, data can be stored in the magnetic memory cell by setting the second magnetic conductive pattern 161 and the first magnetic conductive pattern 130 to either be parallel or anti-parallel to each other.

After the second patterning process, the second mask pattern 192 may be removed. A portion of the second mask pattern 192 may be removed during the second patterning process. Alternatively, the second mask pattern 192 may be left on the upper electrode pattern 171.

When the first patterning process is performed on the first magnetic conductive layer 134, a residual etching by-product may be generated. A portion of the residual etching by-product may be a conductive material. In some embodiments, the residual etching by-product may include a precious metal. Since the precious metal is not easily oxidized, a portion of the residual etching by-product of the first magnetic conductive layer 134 may have conductivity. If a conductive residual etching by-product adheres to a sidewall of the tunnel barrier pattern 151, a short-circuit may occur during operation of the magnetic memory cell. According to the embodiment of FIGS. 5-8, the first magnetic conductive layer 134 is patterned before the second patterning process is performed. As a result, the potential for a residual etching by-product of the first magnetic conductive layer 134 to attach or adhere to a sidewall of the tunnel barrier pattern 151 may be reduced or prevented.

Referring to FIGS. 9 through 12, a magnetic memory device in accordance with a third embodiment and a method of forming the same are described. For the purpose of brevity, the description of common features already discussed above will be omitted.

Figure 9:
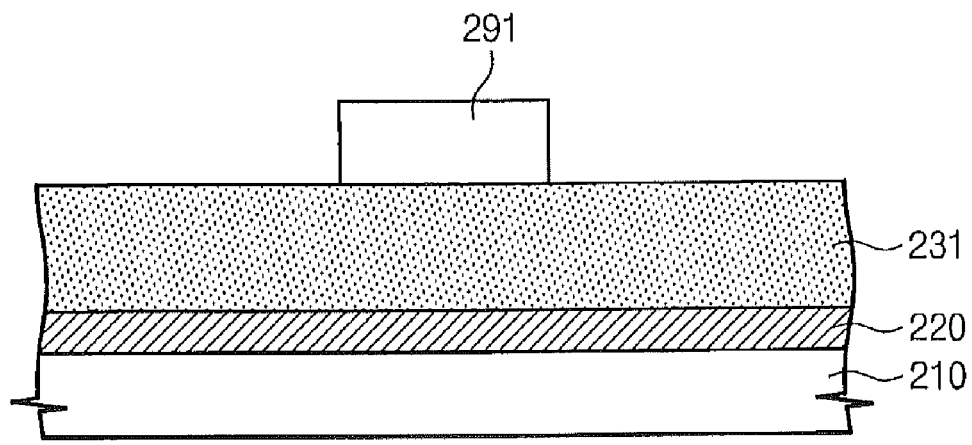
FIGS. 9 through 12 are cross-sectional drawings illustrating a magnetic memory device in accordance with a third embodiment of the inventive concept and a method of forming the same.

Referring to FIG. 9, a lower electrode layer 220 may be formed on a substrate 210. A first magnetic conductive layer 231 may be formed on the lower electrode layer 220. The first magnetic conductive layer 231 may include a ferromagnetic material. In some embodiments, the first magnetic conductive layer 231 may include at least one material selected from iron (Fe), cobalt (Co), nickel (Ni), chrome (Cr), platinum (Pt), palladium (Pd), iridium (Ir), ruthenium (Ru), rhodium (Rh), osmium (Os), rhenium (Re), gold (Au) and copper (Cu). If a current flows in a direction perpendicular to surfaces of the substrate 210 and the first magnetic conductive layer 231, the first magnetic conductive layer 231 may have a magnetization direction parallel to the current. A first mask pattern 291 may be provided on the first magnetic conductive layer 231.

Figure 10:
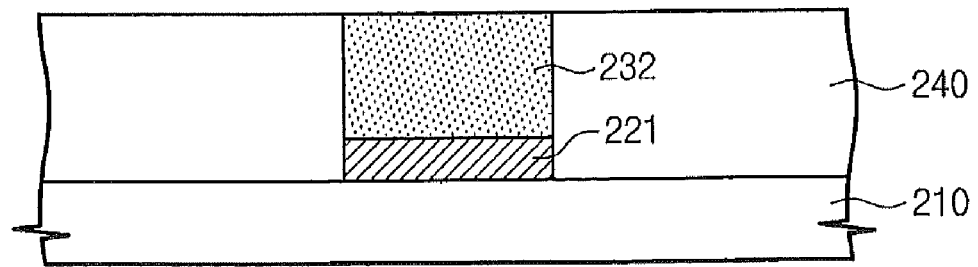

Referring to FIG. 10, a first patterning process may be performed on the lower electrode layer 220 and the first magnetic conductive layer 231 using the first mask pattern 291 as an etching mask. A lower electrode pattern 221 and a first magnetic conductive pattern 232 may be formed by the first patterning process. For example, the first patterning process may be an ion sputtering process and/or a reactive ion etching process. After the first patterning process is completed, the first mask pattern 291 may be removed.

A first interlayer insulating layer 240 may be formed on the substrate 210 that exposes the first magnetic conductive pattern 232. The first interlayer insulating layer 240 may be formed by forming an insulating layer that covers the substrate 210 and the first magnetic conductive pattern 232, and then planarizing this insulating layer to expose the first magnetic conductive pattern 232. The first interlayer insulating layer 240 may be, for example, an oxide layer, a nitride layer or an oxynitride layer. The first interlayer insulating layer 240 may be formed, for example, by a chemical vapor deposition process.

Figure 11:
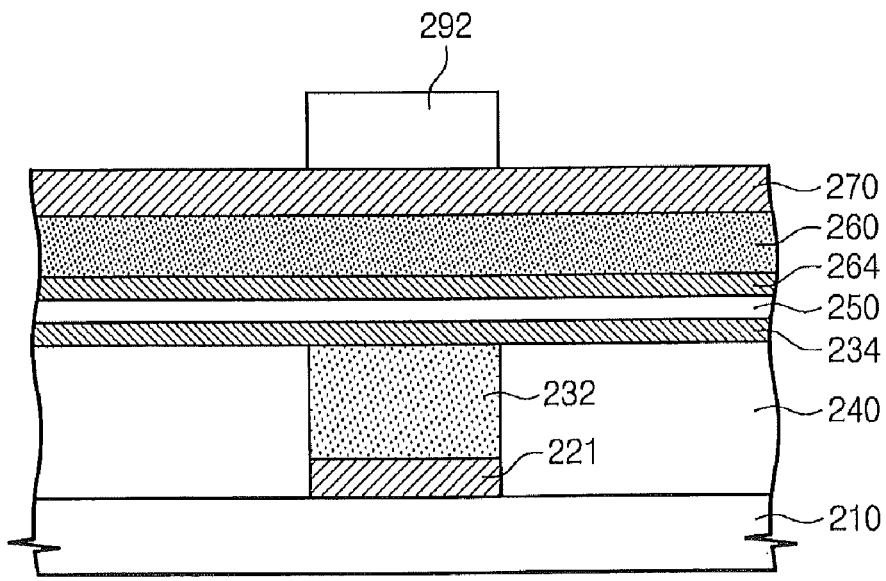
Figure 12:
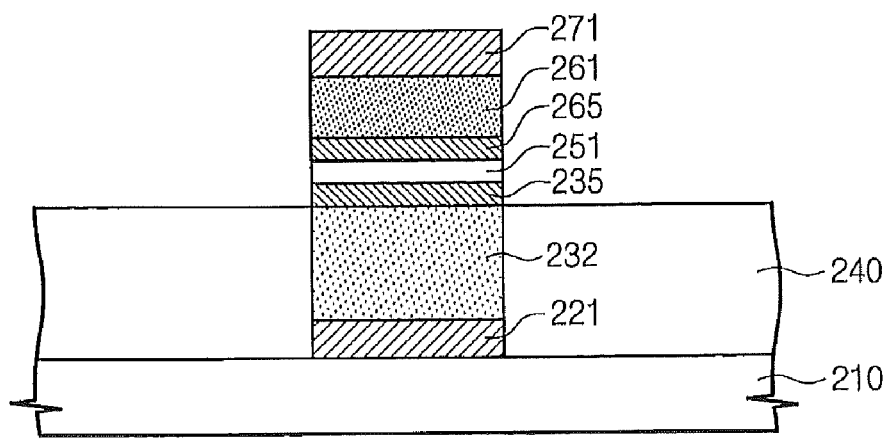

Referring to FIG. 11, a first junction magnetic layer 234, a tunnel barrier layer 250, a second junction magnetic layer 264, a second magnetic conductive layer 260 and an upper electrode layer 270 can be sequentially formed on the first magnetic conductive pattern 232 and the first interlayer insulating layer 240. The first junction magnetic layer 234 may include a soft magnetic material. The first junction magnetic layer 234 may have a low damping constant and a high spin polarization ratio. For example, the first junction magnetic layer 234 may include at least one material selected from cobalt (Co), iron (Fe) and nickel (Ni). The first junction magnetic layer 234 may further include at least one nonmagnetic material, which may include boron (B), zinc (Zn), aluminum (Al), titanium (Ti), ruthenium (Ru), tantalum (Ta), silicon (Si), silver (Ag), gold (Au), copper (Cu), carbon (C) and nitrogen (N). In an exemplary embodiment, the first junction magnetic layer 234 may include CoFe or NiFe and may further include boron (B) in addition to the CoFe or NiFe.

The tunnel barrier layer 250 may include a nonmagnetic insulating material. In some embodiments, this nonmagnetic insulating material may include magnesium oxide or aluminum oxide. The tunnel barrier layer 250 may have the same crystal structure as the first junction magnetic layer 234. As a result, a magnetic resistance ratio of the magnetic tunnel connection including the tunnel barrier layer 250 and the first junction magnetic layer 234 can be improved.

The second junction magnetic layer 264 may include a soft magnetic material. For example, the first and second junction magnetic layers 264 and 234 may include the same material. The materials included in the second junction magnetic layer 264 may alternatively be different from the materials included in the first junction magnetic layer 234.

The second magnetic conductive layer 260 may include ferromagnetic material(s). For example, the second magnetic conductive layer 260 may include at least one material selected from iron (Fe), cobalt (Co), nickel (Ni), chrome (Cr), platinum (Pt), palladium (Pd), iridium (Ir), ruthenium (Ru), rhodium (Rh), osmium (Os), rhenium (Re), gold (Au) and copper (Cu). The upper electrode layer 270 may be formed of the same material as the lower electrode pattern 221. A second mask pattern 292 may be provided on the upper electrode layer 270.

A second patterning process may be performed on the first junction magnetic layer 234, the tunnel barrier layer 250, the second junction magnetic layer 264, the second magnetic conductive layer 260 and the upper electrode layer 270. A first junction magnetic pattern 235, a tunnel barrier pattern 251, a second junction magnetic pattern 265, a second magnetic conductive pattern 261 and an upper electrode pattern 271 may be formed by the second patterning process. For example, the first magnetic conductive pattern 232 and the first junction magnetic pattern 235 may be a reference layer in which a magnetization direction is fixed under an operation current, and the second magnetic conductive pattern 261 and the second junction magnetic pattern 265 may be a free layer in which a magnetization direction may change. The second patterning process may be an ion sputtering process and/or a reactive ion etching process. After the second patterning process, the second mask pattern 292 may be removed.

According to the third embodiment of the inventive concept, the first magnetic conductive layer 231 is patterned before the second patterning process is performed. As a result, the potential for a residual etching by-product of the first magnetic conductive layer 231 to attach or adhere to a sidewall of the tunnel barrier pattern 251 may be reduced or prevented The magnetic memory devices in accordance with the first through third embodiments described above can be mounted with various types of semiconductor packages. For example, semiconductor memory devices in accordance with exemplary embodiments of the inventive concept can be mounted using packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted. The package in which the semiconductor memory devices are mounted may further include a controller that controls the magnetic memory devices and/or logic device.

Figure 13:
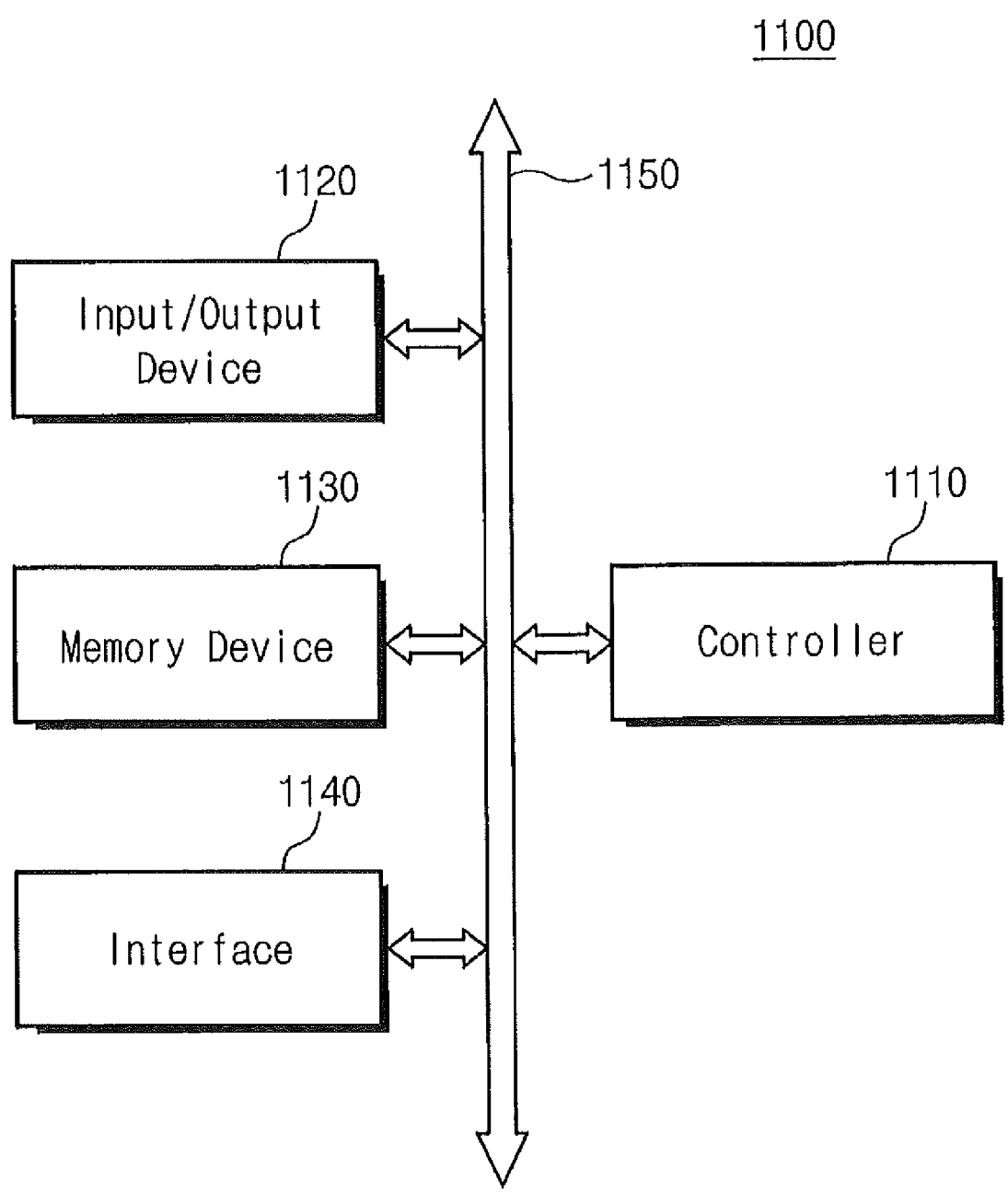
FIG. 13 is a block diagram of an electronic system including a magnetic memory device in accordance with exemplary embodiments of the inventive concept.

FIG. 13 is a block diagram of an electronic system including a semiconductor memory device in accordance with exemplary embodiments of the inventive concept.

Referring to FIG. 13, an electronic system 1100 in accordance with an exemplary embodiment of the inventive concept may include a controller 1110, an input/output device 1120, a memory device 1130, an interface 1140 and a bus 1150. The controller 1110, the input/output device 1120, the memory device 1130 and the interface 1140 can be connected to one another through the bus 1150. The bus 1150 corresponds to a path through which data moves.

The controller 1110 may include at least one of a microprocessor, a digital signal process, a microcontroller and logic devices capable of performing the similar function to the previously recited devices. The input/output device 1120 may include a keypad, a keyboard and a display device. The memory device 1130 may store data and/or commands. The memory device 1130 may include at least one of the semiconductor memory devices disclosed in the first through third embodiments. The memory device 1130 may further include a different type of semiconductor memory device (e.g., a flash memory device, a DRAM device and/or a SRAM device). The interface 1140 can transmit data to a telecommunications network or receive data from a telecommunications network. The interface 1140 may be a wired interface or a wireless interface. For instance, the interface 1140 may include an antenna or a wire-wireless transceiver. Although not illustrated in the drawing, the electronic system 1100 is an operation memory for improving an operation of the controller 1110 and may further include a high speed DRAM and/or a high speed SRAM.

The electronic system 1100 can be applied to a PDA (personal digital assistant), a portable computer, a web tablet, a wireless phone, a mobile phone, a digital music player, a memory card and/or any other devices that can transmit and/or receive data.

Figure 14:
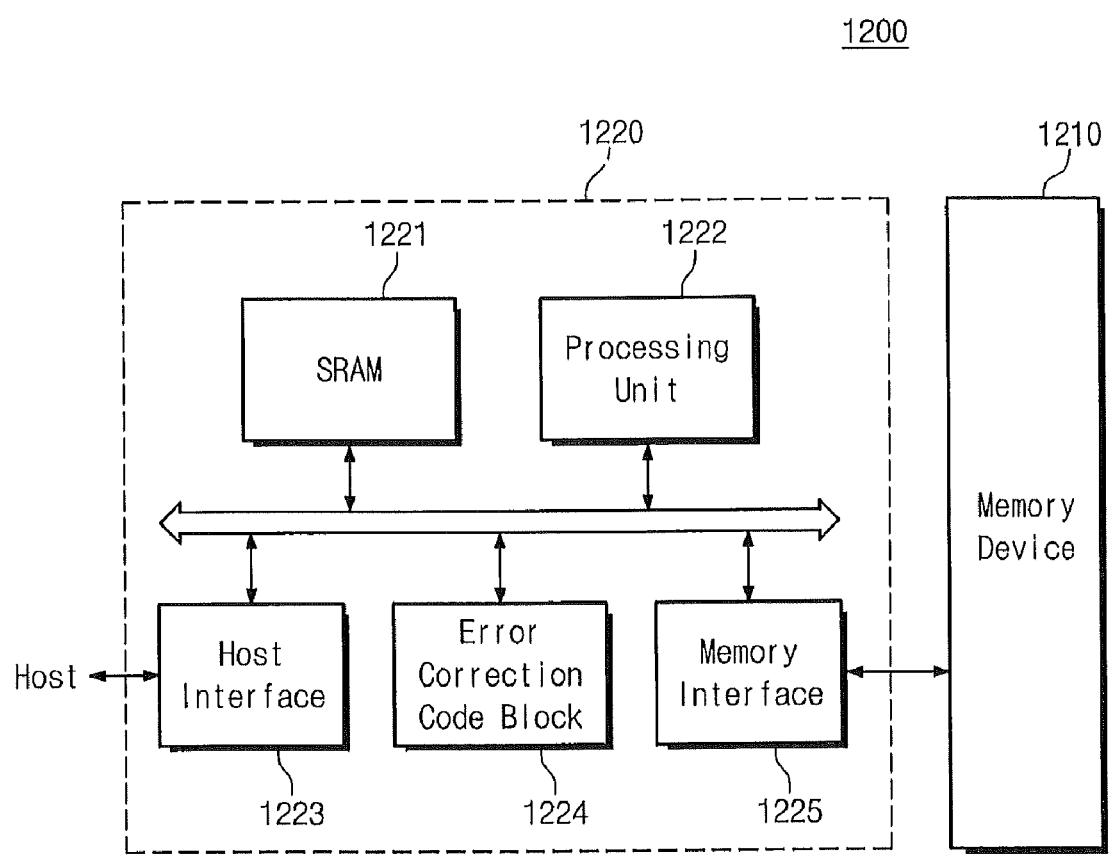
FIG. 14 is a block diagram of a memory card including a magnetic memory device in accordance with exemplary embodiments of the inventive concept.

FIG. 14 is a block diagram of a memory card that includes a magnetic memory device in accordance with exemplary embodiments of the inventive concept.

Referring to FIG. 14, a memory card 1200 in accordance with exemplary embodiments of the inventive concept includes a memory device 1210. The memory device 1210 can include at least one of the semiconductor memory devices disclosed in the first through third embodiments described above. The memory device 1210 may further include a different type of semiconductor memory device (e.g., a flash memory device, a DRAM device and/or a SRAM device). The memory card 1200 may include a memory controller 1220 that controls data exchanges between a host and the memory device 1210.

The memory controller 1220 may include a processing unit 1222 that may control the operation of the memory card 1200. The memory controller 1220 may further include a SRAM 1221 that is used as an operation memory of the processing unit 1222. In addition, the memory controller 1220 may further include a host interface 1223 and a memory interface 1225. The host interface 1223 may include a data exchange protocol between the memory card 1200 and the host. The memory interface 1225 can connect the memory controller 1220 and the memory device 1210. The memory controller 1220 may further include an error correction code (ECC) block 1224. The error correction code (ECC) block 1224 can detect and correct errors in data read from the memory device 1210. Although not illustrated in the drawing, the memory card 1200 may further include a read-only memory (ROM) that stores code data for the interface with the host. The memory card 1200 can be used as a portable data storage card. Alternatively, the memory card 1200 can be embodied by a solid state disk (SSD) which can replace a hard disk of computer system.

According to exemplary embodiments of the inventive concept, the potential for an electrical short to be generated because a residual etching by-product that is generated during a patterning process adheres to a sidewall of the tunnel barrier layer can be reduced and/or prevented.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A magnetic memory device, comprising:
   a first magnetic conductive pattern on a substrate;
   a first interlayer insulating layer that exposes a top surface of the first magnetic pattern while covering sidewalls of the first magnetic pattern on the substrate;
   a tunnel barrier pattern on the first magnetic pattern; and
   a second magnetic conductive pattern on the tunnel barrier pattern, wherein widths of the tunnel barrier pattern and the second magnetic conductive pattern are greater than a width of the first magnetic conductive pattern.

2. The magnetic memory device of claim 1, further comprising a lower electrode having a sidewall that is aligned with a sidewall of the first magnetic conductive pattern between the substrate and the first magnetic conductive pattern.

3. The magnetic memory device of claim 2, wherein the first magnetic conductive pattern comprises a pinning pattern.

4. The magnetic memory device of claim 3, wherein the first magnetic conductive pattern further comprises a pinned pattern on the pinning pattern.

5. The magnetic memory device of claim 4, further comprising an upper electrode on the second magnetic conductive pattern.

6. The magnetic memory device of claim 4, wherein the pinned pattern comprises a first ferromagnetic pattern, a non-magnetic pattern and a second ferromagnetic pattern.

7. The magnetic memory device of claim 6, further comprising an additional ferromagnetic layer on the second ferromagnetic pattern.

8. The magnetic memory device of claim 7, wherein the additional ferromagnetic layer has the same magnetization direction as the magnetization direction of the second ferromagnetic layer.

* * * * *